United States Patent [19]
Merrill et al.

[11] Patent Number: 5,962,844
[45] Date of Patent: Oct. 5, 1999

[54] ACTIVE PIXEL IMAGE CELL WITH EMBEDDED MEMORY AND PIXEL LEVEL SIGNAL PROCESSING CAPABILITY

[75] Inventors: Richard Billings Merrill, Woodside; Albert Bergemont; Min-hwa Chi, both of Palo Alto, all of Calif.

[73] Assignee: Foveon, Inc., Santa Clara, Calif.

[21] Appl. No.: 08/923,370

[22] Filed: Sep. 3, 1997

[51] Int. Cl.$^6$ .......................... H01L 27/148; H04N 5/335
[52] U.S. Cl. .................................... 250/214 A; 250/208.1; 257/431; 257/222; 257/225; 348/308
[58] Field of Search ........................... 250/214 A, 214 R, 250/208.1, 208.2; 257/222, 225, 226, 228, 231, 233, 431, 443, 461; 348/308, 302, 294

[56] References Cited

U.S. PATENT DOCUMENTS

| | | | |
|---|---|---|---|
| 5,448,056 | 9/1995 | Tsuruta | 250/214 A |
| 5,541,402 | 7/1996 | Ackland et al. | 250/208.1 |
| 5,576,763 | 11/1996 | Ackland et al. | 348/308 |
| 5,608,243 | 3/1997 | Chi et al. | 257/249 |
| 5,739,562 | 4/1998 | Ackland et al. | 257/291 |

OTHER PUBLICATIONS

A Random Access Photodiode Array for Intelligent Image Capture; Pecht et al.; IEEE Transactions on Electron Devices; vol. 38, No. 8; pp. 1772–1780; Aug. 1991.

Dickinson, A. et al., "TP 13.5: A 256×256 CMOS Active Pixel Image Sensor with Motion Detection," *IEEE* Internal Solid–State Circuits Conference, (1995) pp. 226–227; Slide Supplement pp. 180–181; pp. 350–351, Feb./1995.

*Primary Examiner*—John R. Lee
*Attorney, Agent, or Firm*—Limbach & Limbach LLP

[57] ABSTRACT

An active pixel image cell which includes a photosensor and an embedded memory element and may be used to produce signals corresponding to the photosensor outputs for successive frames. The structure of the active pixel cell includes an analog, non-volatile, or dynamic memory element and the control elements needed to store the output of the photosensor generated during a previous frame. The pixel elements then generate a signal representing the current frame output of the photosensor. The current frame output and previous frame output are then provided as output signals for the pixel and may be subjected to off-pixel processing as desired. For example, the two values may be subtracted from one another by an off-pixel difference amplifier to form a signal representing the difference between the image on the photodiode sensor of the pixel between successive frames. The difference signal may then be used for purposes of video compression, motion detection, or image stabilization.

14 Claims, 6 Drawing Sheets

ACTIVE PIXEL IMAGE CELL WITH EMBEDDED MEMORY AND PIXEL LEVEL SIGNAL PROCESSING CAPABILITY

TECHNICAL FIELD

The present invention relates to active pixel image cells, and more specifically, to a design for such a cell with includes an embedded memory element and the control elements required to provide outputs representing the response of a photosensor for successive frames. The outputs of the pixel can be combined with a signal processing capability to produce a signal representing the difference between the pixel outputs for successive frames. Another embodiment of the invention is directed to a design for an active pixel image cell which provides an output representing the difference between the photosensor response for successive frames.

BACKGROUND OF THE INVENTION

Charge-coupled devices (CCDs) are used in conventional imaging circuits for converting the light incident on a pixel into an electrical signal that is proportional to the intensity of the incident light. In general, CCDs utilize a photogate to convert the incident photons into an electrical charge, and a series of electrodes to transfer the charge collected at the photogate to an output node.

Although CCDs have many strengths including a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, imaging circuits based on active pixel sensor cells have been developed. In an active pixel sensor cell, a conventional photodiode is combined with a number of active transistors which, in addition to forming an electrical signal representing the output of the photodiode, provide amplification, readout control, and reset control for the pixel. Arrays of active pixel sensor cells can be used in multimedia applications requiring low-cost and high functionality to acquire high quality images at video frame rates. Because the elements of an active pixel sensor are fabricated using a CMOS process flow, the sensor may easily be integrated into more complex CMOS-based devices to produce combined sensor-signal processor devices.

FIG. 1 is a schematic showing an example of a conventional CMOS active pixel sensor cell 10. As shown in the figure, cell 10 includes a photodiode 12 connected to a first intermediate node (labelled "node 1" in the figure), and a reset transistor 14 that has a drain connected to a power supply node $N_{ps}$, a source connected to node 1, and a gate connected to a first input node (labelled "reset" in the figure).

Cell 10 further includes a buffer transistor 16 and a row-select transistor 18. Buffer transistor 16 has a drain connected to node $N_{ps}$, a source connected to a second intermediate node (labelled "node 2" in the figure), and a gate connected to node 1. Row-select transistor 18 has a drain connected to node 2, a source connected to a third intermediate node (where the source line intersects the column data line in the figure), and a gate connected to a second input node (labelled "row select" in the figure).

The operation of cell 10 begins by briefly pulsing the gate of reset transistor 14 with a reset voltage $V_{RESET}$ at time $t_1$. The reset voltage $V_{RESET}$, which is equal to Vcc (typically, +5 V), resets the voltage on photodiode 12 to an initial integration voltage and begins an image collection cycle.

At this point, the initial integration voltage on photodiode 12 (as measured at node 1) is defined by the equation $V_{RESET} - V_{T14} - V_{CLOCK}$, where $V_{T14}$ represents the threshold voltage of reset transistor 14, and $V_{CLOCK}$ represents reset noise from the pulsed reset voltage (assumed to be constant). Similarly, the initial integration voltage as measured at node 2 is defined by the equation $V_{RESET} - V_{T14} - V_{CLOCK} - V_{T16}$, where $V_{T16}$ represents the threshold voltage of output buffer transistor 16 (functioning in a source follower mode).

After the reset voltage $V_{RESET}$ has been pulsed and the voltage on photodiode 12 (as measured at node 1) has been reset, a row-select voltage $V_{RS}$ is applied to the second input node (row select) at a time $t_2$ which immediately follows the falling edge of the reset pulse $V_{RESET}$. The row select voltage $V_{RS}$ causes the voltage on node 2, which represents the initial integration voltage of the cycle, to appear on the third intermediate node (where the source of row select transistor 18 intersects the column data line). Detection and calculation circuit 20 connected to the column data line then amplifies, digitizes, and stores the value of the initial integration voltage as it appears on the third intermediate node.

Detection and calculation circuit 20 typically contains a sense amplifier and a second amplifier which performs a correlated double sampling to compute the difference in the sense amplifier output prior to and after strobing charge out of the pixel. This acts to remove charge fluctuation on the column line (the kTC thermal charge noise component) during reset of the sense amplifier which might otherwise contribute to the readout signal. Circuit 20 is located off-pixel and is typically shared by all of the pixels in a column of an imaging array.

Next, from time $t_2$, which represents the beginning of the image collection cycle, to a time $t_3$, which represents the end of the image collection cycle, light energy, in the form of photons, strikes photodiode 12, thereby creating a number of electron-hole pairs. Photodiode 12 is designed to limit recombination between the newly formed electron-hole pairs. As a result, the photogenerated holes are attracted to the ground terminal of photodiode 12, while the photogenerated electrons are attracted to the positive terminal of photodiode 12. Each additional electron reduces the voltage on photodiode 12 (as measured at node 1). Thus, at the end of the image collection cycle, a final integration voltage will be present on photodiode 12.

At this point (time $t_3$), the final integration voltage on photodiode 12 (as measured at node 1) is defined by the equation $V_{RESET} - V_{T14} - V_{CLOCK} - V_S$, where $V_S$ represents the change in voltage due to the absorbed photons. Similarly, the final integration voltage as measured at node 2 is defined by the equation $V_{RESET} - V_{T14} - V_{CLOCK} - V_{T16} - V_S$.

At the end of the image collection cycle (time $t_3$), the row-select voltage $V_{RS}$ is again applied to the row select input node. The row select voltage $V_{RS}$ causes the voltage on the second intermediate node, which represents the final integration voltage of the cycle, to appear on the third intermediate node. Detection and calculation circuit 20 then amplifies and digitizes the value of the final integration voltage as it appears on the third intermediate node.

Following this, detection and calculation circuit 20 determines the number of photons that have been collected during the integration cycle by calculating the difference in voltage between the digitized final integration voltage taken at time $t_3$ and the digitized stored initial integration voltage taken at time $t_2$. At this point, the voltage difference is defined by the equation $(V_{RESET}-V_{T14}-V_{CLOCK}V_{T16})-(V_{RESET}-V_{T14}-V_{CLOCK}-V_{T16}-V_S)$, thereby yielding the value $V_S$.

Once the final integration voltage has been digitized by the detection and calculation circuit, the reset voltage $V_{RESET}$ is again applied to the first input node at time $t_4$, which immediately follows the rising edge of the row select voltage $V_{RS}$ at time $t_3$. The reset voltage $V_{RESET}$ again resets the voltage on photodiode 12 to begin another image collection cycle.

Image processing of the pixel output is normally performed after the image is captured, converted to a digital format, and moved to a main memory where it is operated upon by the central processing unit. Each of these data manipulation or processing operations requires the consumption of power and acts to limit the maximum throughput rate for video signals. These factors are important for portable imaging applications, which represents a primary area of growth at the present time for active pixel sensors. Many of the basic image processing operations used in such applications require relatively simple arithmetic operations, e.g., the value of a pixel relative to its previous value or to that of adjacent pixels. Applications of such arithmetic operations include motion detection, image stabilization, and video compression.

For example, in order to perform video compression, the current output of a pixel (i.e., the pixel's photosensor) is read out of a pixel and then subtracted from the output corresponding to the previous frame, which had been read out and stored in an off-pixel storage element. A difference signal representing the change in the pixel output for successive frames is then sent to the periphery of the array. This subtraction operation is typically performed by a difference amplifier which is also located off-pixel. This approach requires less information to be transferred and processed external to the imaging cell than would be required to read out and store the two pixel values in main memory and have the processing unit perform the differencing operation. While this method reduces the power consumption and increases the system performance compared to storing both pixel values, it still requires significant off-pixel processing and system overhead. This is because it requires the system to read out one pixel output value, store it off-pixel, read out a second value and transfer it to a location off-pixel, and then perform the differencing operation.

The article entitled "TP 13.5: A 256×256 CMOS Active Pixel Image Sensor with Motion Detection", A. Dickinson et al., Digest of Technical Papers 1995 IEEE International Solid-State Circuits Conference, page 226 et seq., describes the use of an active pixel's floating diffusion output node as a dynamic storage element. The storage capability of the node is used to provide a signal representing the pixel output for a previous frame. This value is read out to the first of two sample and hold capacitors located off-pixel. The pixel output for the current frame is then read out to the second capacitor. The contents of the two capacitors are then provided as the inputs to a differential amplifier, with the amplifier output being a signal representing the difference between the pixel outputs for successive frames.

Although this structure can be used to generate the difference signal required for video compression, motion detection, etc., it has the disadvantage that the storage and control elements used to determine the difference between pixel outputs for successive frames are located off-pixel. The pixel itself generates only an output signal, either corresponding to the previous frame or the current frame. Because of this arrangement, each of the two signals needed to compute the difference of the pixel output for successive frames is read out separately and stored in its own off-pixel storage element. This increases the number of clock cycles required to process the pixel outputs to obtain the difference signal, thereby slowing down the operation of the imager.

What is desired is a structure for an active pixel image cell which includes an embedded memory element and the control elements needed to simultaneously generate as pixel outputs the signals required for determining the difference between the pixel output for successive frames. Generating the two outputs at the pixel level reduces the memory and processing demands of off-pixel processors, and increases the speed with which images can be acquired. It is also desired to have a structure for an active pixel image cell which includes elements for performing a differencing operation and generates an output signal representing the difference between pixel outputs for successive frames. These and other advantages of the present invention will be apparent to those skilled in the art upon a reading of the Detailed Description of the Invention together with the drawings.

SUMMARY OF THE INVENTION

The present invention is directed to an active pixel image cell which includes an embedded memory element and the control elements required to store and transfer signals representing the output of the pixel photodiode and provide them as an output of the pixel. The pixel elements may be used to simultaneously produce signals corresponding to the photodiode outputs for successive frames or to produce an output representing the difference between the photodiode outputs for successive frames. The structure of the active pixel cell includes an analog, non-volatile, or dynamic memory element and the control elements needed to store the output of the pixel photodiode generated during a previous frame. The pixel elements then generate a signal representing the current frame output of the pixel. The current frame output and previous frame output are then provided as output signals for the pixel and may be subjected to off-pixel processing as desired. For example, the two values may be subtracted from one another by an off-pixel difference amplifier to form a signal representing the difference between the image on the photodiode sensor of the pixel between successive frames. The difference signal may then be used for purposes of video compression, motion detection, or image stabilization. In another embodiment, the pixel elements may be used to generate the difference signal as an output of the pixel.

Further objects and advantages of the present invention will become apparent from the followings detailed description and accompanying drawings.

DETAILED DESCRIPTION OF THE INVENTION

The inventors of the present invention have recognized that an aspect of the development of active pixels is that the smallest practical pixel size is limited by physical principles (vibration and the diffraction limited resolution, which is a function of wavelength and aperture size), while the feature size of the active transistors continues to shrink. This is in contrast to devices such as memory cells, wherein the cell size shrinks with the feature size so that the number of transistors per cell remains fixed. This feature of active pixel sensors means that the number of transistors which may be incorporated into each active pixel will continue to increase as the smallest feature size continues to decrease. This suggested to the inventors that pixel level elements might be used to perform additional signal generation and conditioning functions, and possibly even focal plane level image processing. In such a case processing capability is incorporated at the pixel level in the form of additional transistors. Such a processing capability would improve the throughput of imaging systems, reduce the power consumption, and free the central processing unit to perform other tasks.

Figure 2:
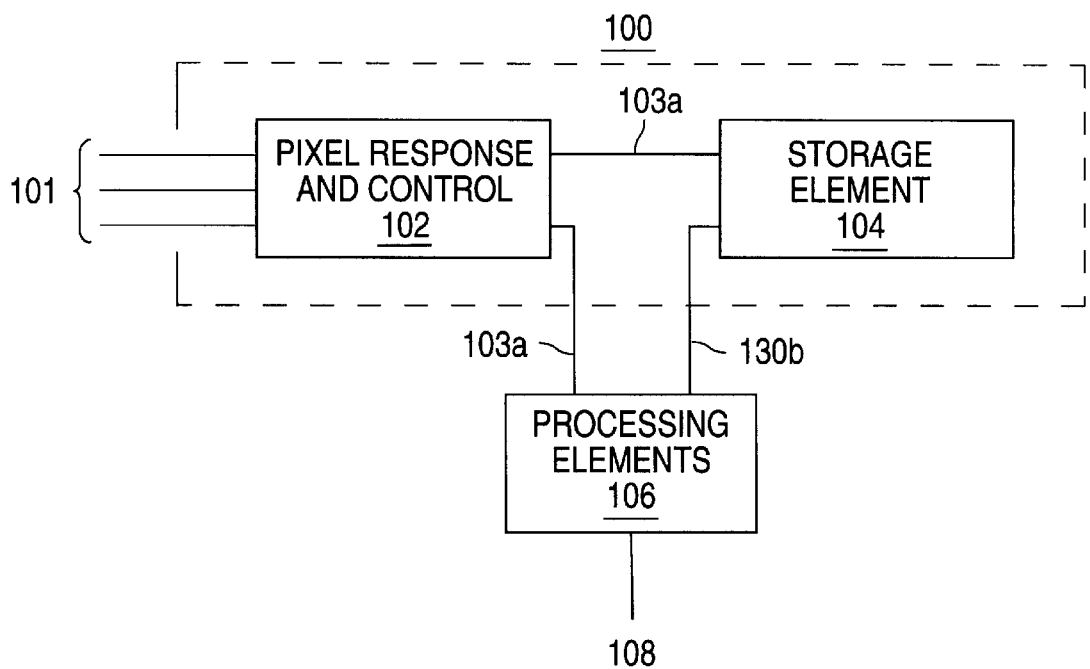
FIG. 2 is a block diagram showing the active pixel cell with embedded memory element of the present invention and the associated off-pixel signal processing elements which may be used for purposes of video compression.

FIG. 2 is a block diagram showing the active pixel cell with embedded memory element 100 of the present invention and the associated off-pixel signal processing elements which may be used for purposes of video compression. The elements labelled "Pixel Response and Control 102" and "Storage Element 104" would be found in the active pixel cell itself. Control signals for operating the pixel are provided by means of control lines 101. Processing elements 106 would typically be located off-pixel and connected to a column of such pixels in an array. This allows multiple pixels to share the functions of the processing elements.

In the present invention, active pixel cell response and control elements 102 include a photodiode (or other photosensor) and associated transistors which are used to control the operation of pixel 100, and act to produce a signal representing the photo response of the pixel. Pixel 100 also includes a memory element 104 incorporated into the pixel. Pixel 100 is operated by applying signals to control lines 101. The associated signal processing elements 106 used to perform the desired operations on the pixel output(s) may also be incorporated in the pixel. An embodiment of the present invention which includes signal processing elements for performing a difference operation at the pixel level will be described later.

Depending upon the signal processing operations to be performed on the photodiode outputs, and owing to the physical size of processing elements such as difference amplifiers and the desire to maintain a small pixel size to achieve higher resolution, such elements may best be located off-pixel. In such a case access to the off-pixel elements would typically be shared by multiple pixels.

Figure 1:
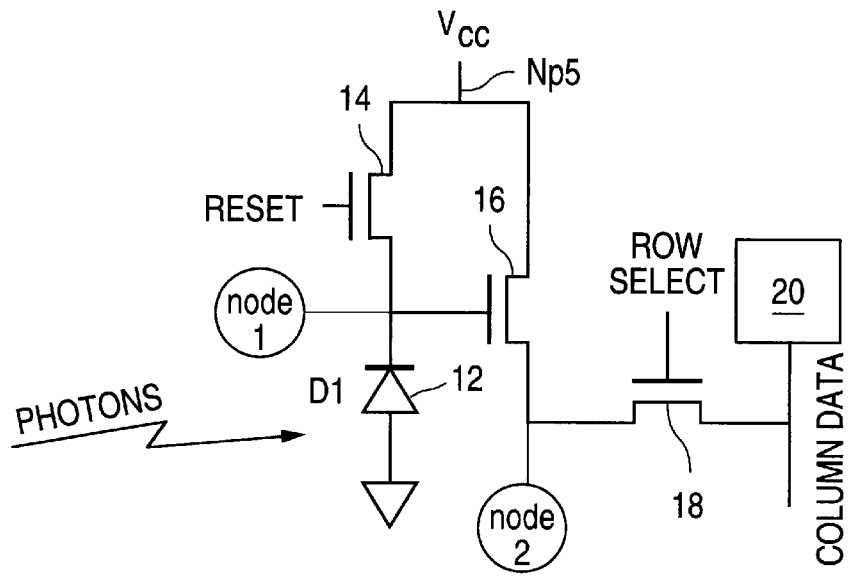
FIG. 1 is a schematic showing an example of a conventional CMOS active pixel sensor cell.

The design of the photosensor and associated transistors and control lines may be based on active pixel sensor 10 of FIG. 1, with the output of the pixel being represented by the signal produced on the column data line of FIG. 1. As shown by the connections between the elements of FIG. 2, during each pixel integration cycle, the pixel output is provided to both memory element 104 and signal processing elements 106. This signal is labelled 103a in the figure and represents the output of the pixel's sensor for the current frame. In addition, during each cycle, the data stored in memory element 104 during a previous cycle is read out to signal processing elements 106. This signal is labelled 103b in the figure, and represents the output of the pixel for the previous frame. In one embodiment of the invention, signal processing elements 106 then use signal 103a corresponding to frame (n−1), and signal 103b corresponding to frame (n−1) to generate output signal 108. For example, signal processing elements 106 may consist of an integrator, adder, or difference amplifier with inputs properly configured to produce the difference of the output signals from frame (n) and frame (n−1) as output signal 108.

Pixel level memory element 104 can take the form of an analog element such as a capacitor, a non-volatile memory element, or a dynamic memory element. Memory element 104 should be of such a type that its fabrication is compatible with the CMOS process flow used to form photosensor and associated transistors 102. Similarly, the elements of signal processing element 108 should also be compatible with a CMOS process flow. The type of memory element used will depend to some extent on the processing requirements of the environment in which the device is to be used. For example, a non-volatile memory element could be used in situations where the signal is to be subtracted from an infrequently changing reference value, such as a leakage map or flat field.

As noted, output signal 108 may represent the difference between the output signals generated by a single pixel for two successive frames. This value is sent to the periphery of the active pixel cell array, where it may be processed for purposes of motion detection, image stabilization, or video compression. As the difference signal is of use in a multitude of applications, incorporating the elements into each pixel which are required to produce the two signals used to obtain the difference signal is an efficient way to produce the difference signal.

Figure 3:
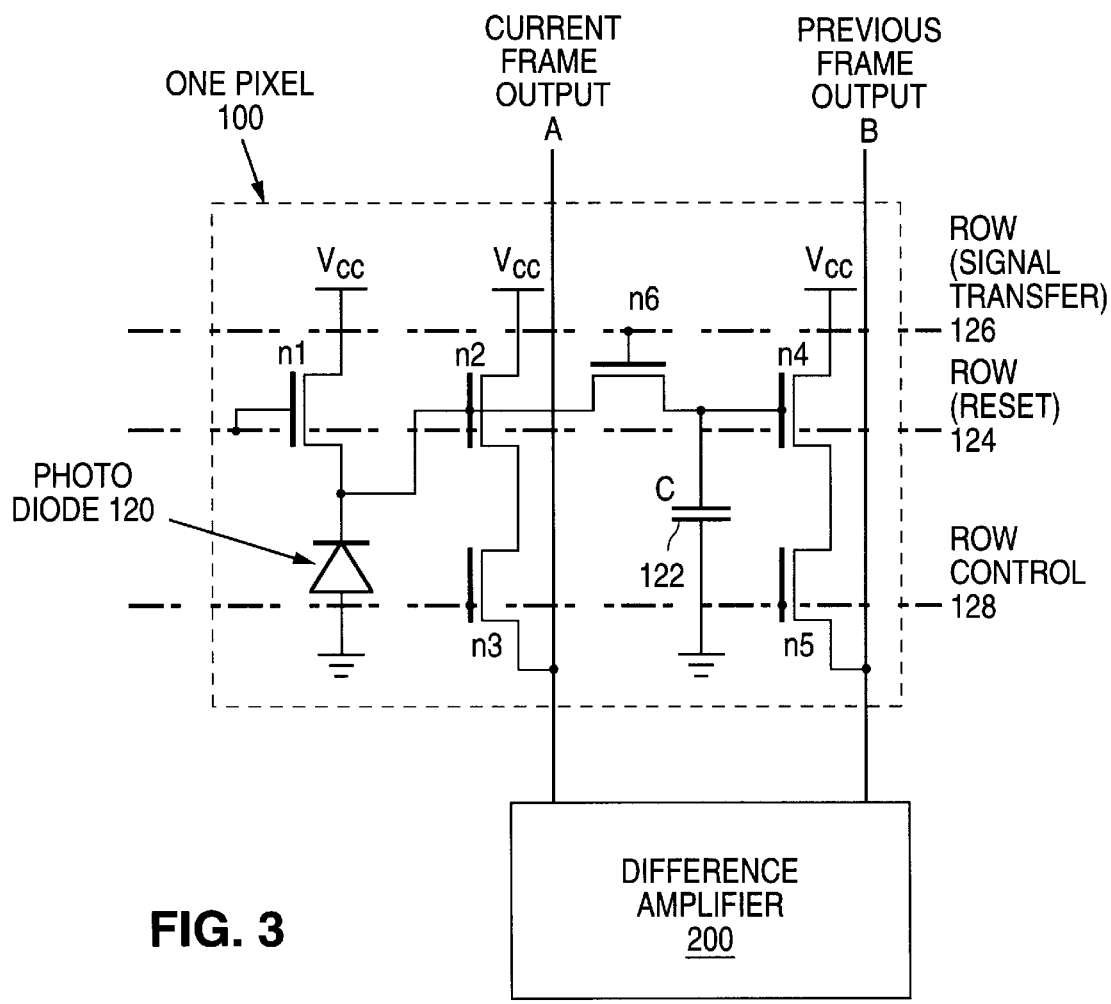
FIG. 3 is a schematic diagram showing the elements contained in a first embodiment of an active pixel cell of the present invention.

FIG. 3 is a schematic diagram showing the elements contained in a first embodiment of an active pixel cell 100 of the present invention. In this embodiment, the pixel provides as outputs the output of the pixel photodiode for the current frame and for the previous frame. This embodiment is useful if the pixel outputs are needed both for determining the difference signal and for additional signal processing operations. In the figure the outputs of pixel 100 are shown as providing the inputs to difference amplifier 200 which is used to process the two inputs and produce an output representing the difference between the pixel outputs for successive frames. Of course, other types of signal processing functions may be performed by different processing elements, with such elements being incorporated at the pixel level or located off-pixel.

As shown in the figure, pixel 100 consists of a photodiode detector 120, six transistors (labelled "n1, . . . , n6" in the figure) and one capacitor 122. Transistor n1 is used to reset photodiode 120. Transistors n2 and n4 are sensing transistors having a conductance which is modulated by the gate potential. They turn on and provide a conducting path when the gate potential reaches a high enough level. Thus, they act as switches which pass the sensed, integrated photocharge from photodiode 120 through transistor n3 (when row control line 128 is pulsed high) to provide the current frame's output, or from capacitor 122 through transistor n5 to provide the previous frame's output. Transistors n3 and n5 serve as pixel output control switches, enabling the currently integrated potential of photodiode 120 or stored potential to be output to difference amplifier 200. Transistor n6 is used as a frame output signal transfer switch and acts to transfer the output signal corresponding to the current frame to the storage (memory) element. Capacitor 122 is used as an analog memory element.

To operate the active pixel sensor of the present invention shown in FIG. 3, at the beginning of a sensing cycle, photodiode 120 is reset using a row reset control signal applied to row reset line 124. The row reset control signal causes transistor n1 to turn on and form a path to conduct any accumulated image electrons to Vcc. After reset, photodiode 120 begins accumulating image generated photoelectrons. At the end of the signal integration period, the integrated photodiode 120 potential is output through transistor n3 to difference amplifier 200 (by pulsing row control line 128) and is also transferred to storage capacitor 122. This corresponds to a first output of the photodiode sensor and is accomplished by pulsing row signal transfer control line 126 high. This causes transistor n6 to turn on and permit the transfer of the integrated signal through transistor n6 to storage capacitor 122.

Next, photodiode 120 is reset again to begin integration of the next frame's signal. As before, photodiode 120 is reset using a row reset control signal applied to row rest line 124. After reset, photodiode 120 begins accumulating image electrons. At the end of the signal integration period, row control line 128 is pulsed. This causes both transistor n3 and n5 to turn on. When transistor n3 turns on, the integrated signal for the present frame is output from photodiode 120 and hence pixel 100, and provided as an input to difference amplifier 200. This corresponds to the second output from the photodiode sensor. When transistor n5 turns on, the integrated signal for the previous frame is output from storage capacitor 122 and provided as a second input to difference amplifier 200. Difference amplifier 200 then outputs a signal representing the difference of its two inputs. This represents Output (frame n)−Output (frame n−1). This difference signal may then be further processed in more complicated signal processing operations.

Figure 4:
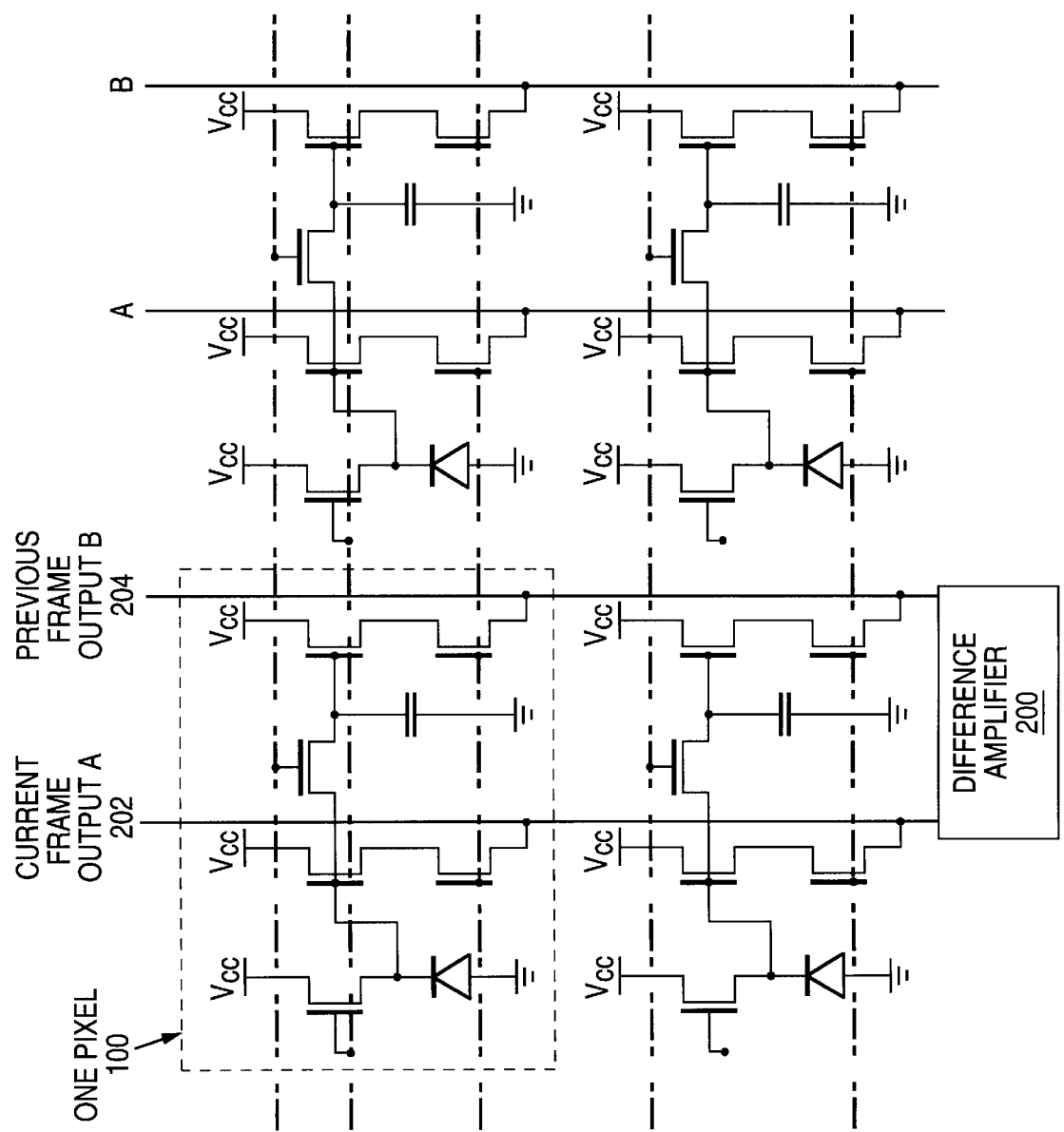
FIG. 4 is a schematic diagram showing how a plurality of the active pixel cells of FIG. 3 may be combined into an imaging array.

FIG. 4 is a schematic diagram showing how a plurality of the active pixel cells 100 of FIG. 3 may be combined into an imaging array. The figure shows a section of an imaging array containing four pixels 100 arranged into two rows and two columns. As shown in the figure, difference amplifier 200 may be connected to current frame 202 and previous frame 204 output lines which connect the current frame and previous frame output nodes, respectively, of the pixels in the same column.

Figures 5A, 5B:
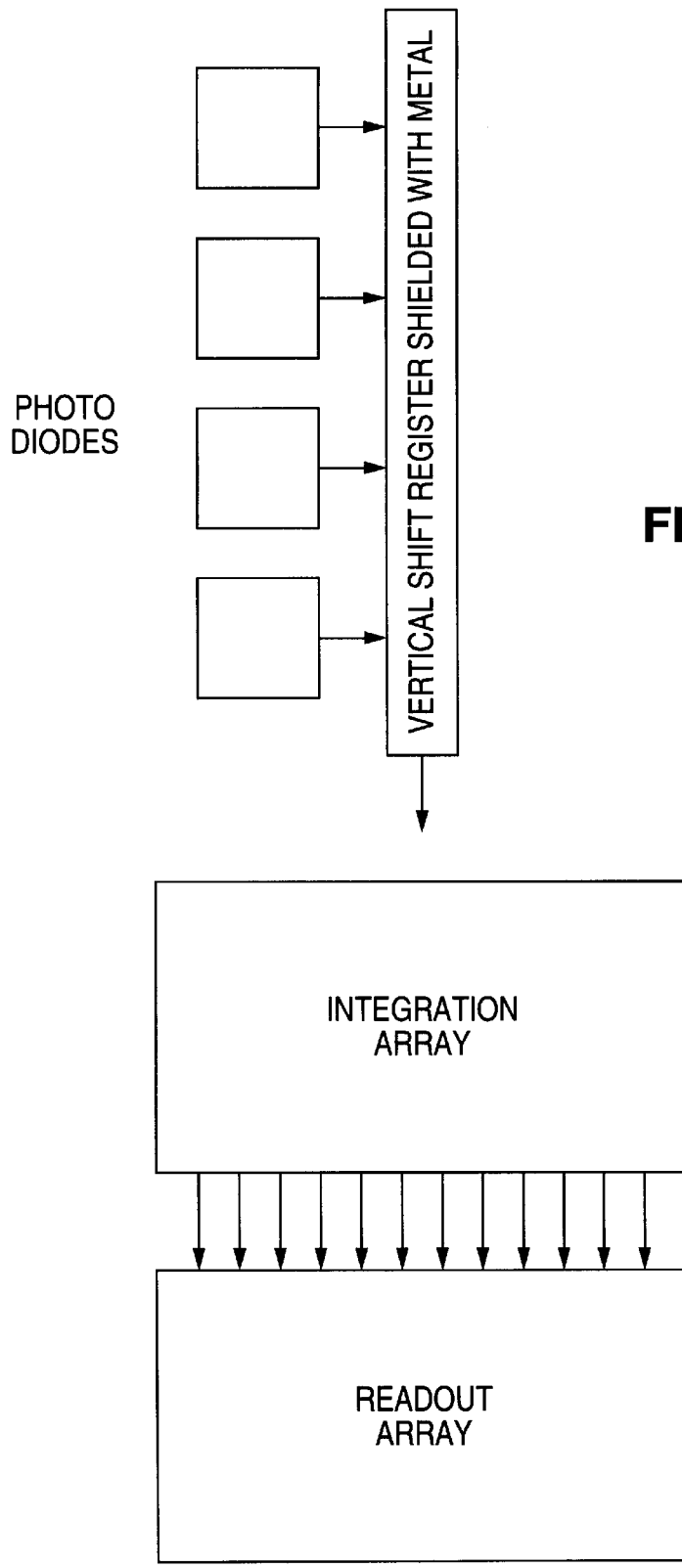
FIGS. 5A and 5B are block diagrams showing how an electronic shutter may be implemented in prior art CCD sensor imaging arrays.

Because the pixel of the present invention is capable of allowing the photodiode output for the previous frame to be read out while the pixel is integrating, it may be used to implement an electronic shuttering function. In CCD sensor based arrays, shuttering is accomplished by shifting the image after integration from the photodiode array to a storage site which is not light sensitive. This may be performed by either a lateral transfer to a vertical shift register that is covered with a metal layer (termed an "interline transfer" and shown in FIG. 5A), or by shifting the output signals for an entire frame downward to a storage array covered with metal (termed a "frame transfer" and shown in FIG. 5B).

Figure 6:
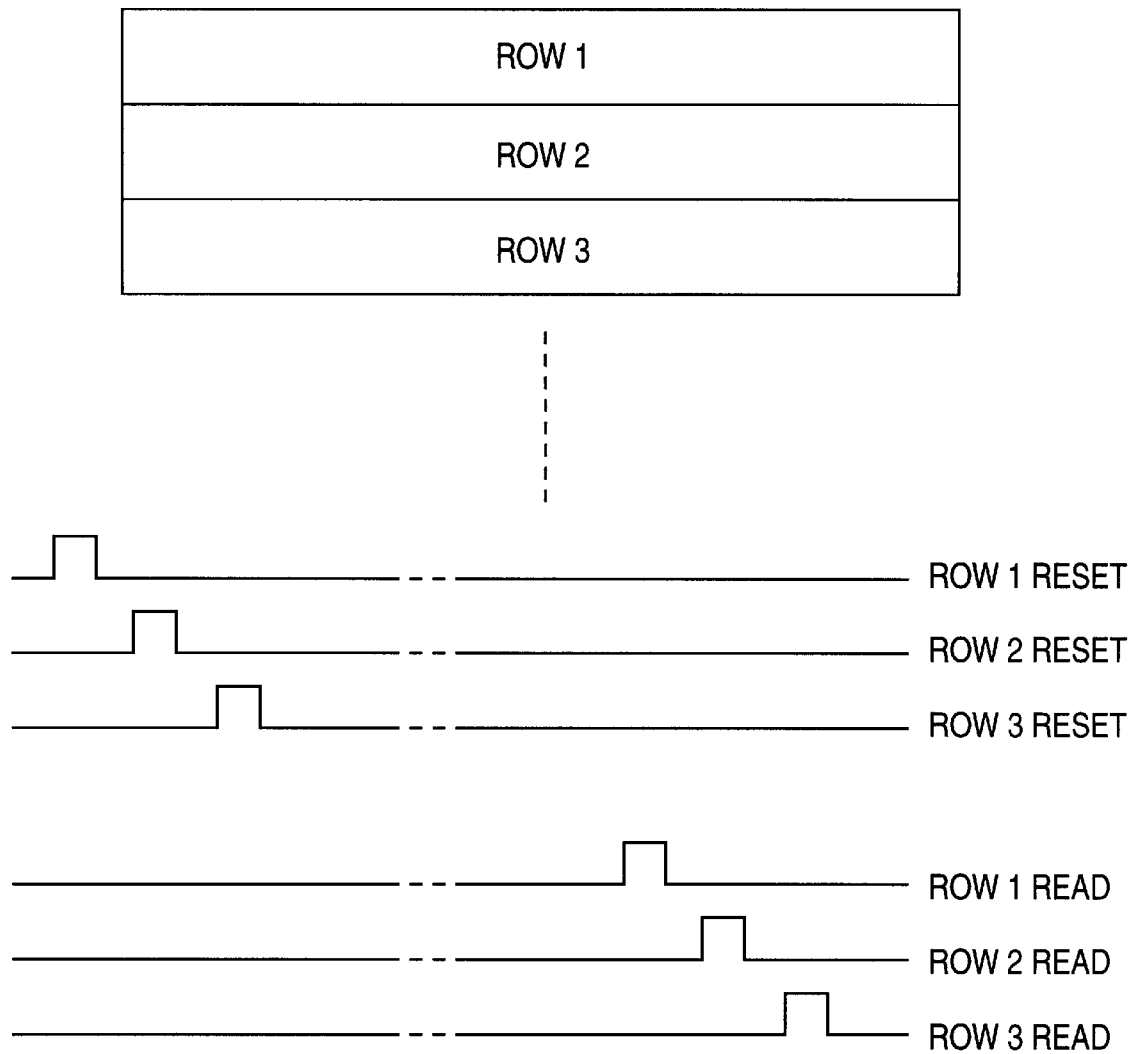
FIG. 6 is a timing diagram showing how, in the absence of an electronic shutter, different rows of an imaging array integrate different time slices of an image.

However, current active pixel sensor designs do not include elements capable of implementing a shuttering function. Without such an electronic shutter, the imaging system either uses a mechanical shutter which adds bulk and cost to the system, or produces images having artifacts introduced by integrating different parts of the image at different times during the exposure. This effect is shown in FIG. 6, which is a timing diagram showing how, in the absence of an electronic shutter, different rows of an imaging array integrate different time slices of an image.

Figure 7:
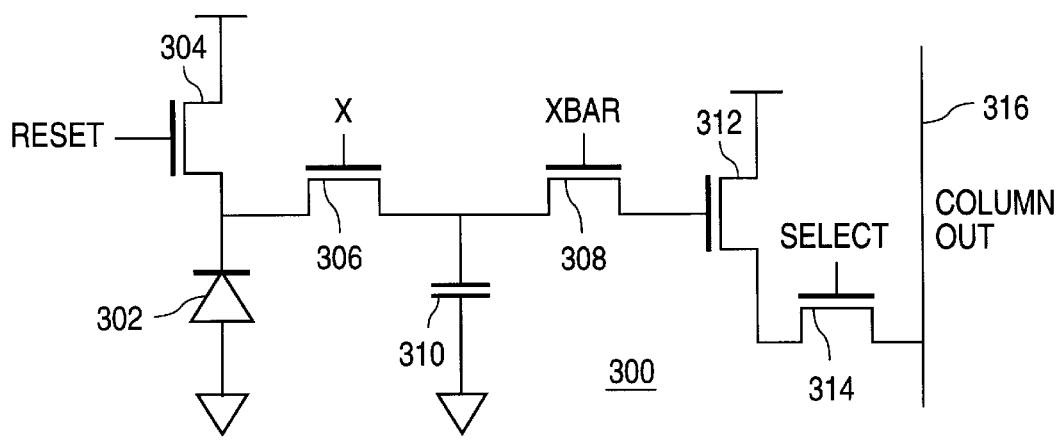
FIG. 7 is a schematic diagram showing the elements contained in a second embodiment of an active pixel cell of the present invention.

FIG. 7 is a schematic diagram showing the elements contained in a second embodiment of an active pixel cell 300 of the present invention which may be used to implement an electronic shuttering function. As shown in the figure, pixel 300 includes sensor 302 (shown as a photodiode) and reset transistor 304 connected to a reset control line. Transistor 306 is used to transfer the output of photodiode 302 to storage element 310 (shown as a capacitor). Transistor 308 is used to transfer the signal stored in storage element 310 to pixel output buffer transistor 312. Select transistor 314 is used to transfer the output of buffer transistor 312 to column output line 316.

The pixel value (the photodiode output) from the integration interval is stored on the non-photosensitive storage element 310. This signal can be read out of the storage element as needed. During readout, another integration can be started. This will increase the effective exposure time for the pixel and permit each pixel in an array to be operated in a manner (using appropriately spaced timing signals) which results in the pixels having the same integration period.

In operation, photodiode 302 is reset by application of a reset pulse to transistor 304. During the integration period, clock signal x is applied to transistor 306. This causes the voltage on capacitor 310 to track that output by photodiode 302. The extra capacitance of storage element 310 will increase the charge storage capability of the pixel. At the end of the integration period, clock signal x is turned off and clock signal x-bar (the inverse of x) is applied to transistor 308. This causes the pixel value stored in storage element 310 to be provided to buffer transistor 312. When an appropriate select signal is applied to transistor 314, the pixel value is provided as a pixel output on column line 316. It is noted that the clock noise of clock signal x turning off will, to first order, cancel the clock noise of clock signal x-bar turning on.

Figure 8A:
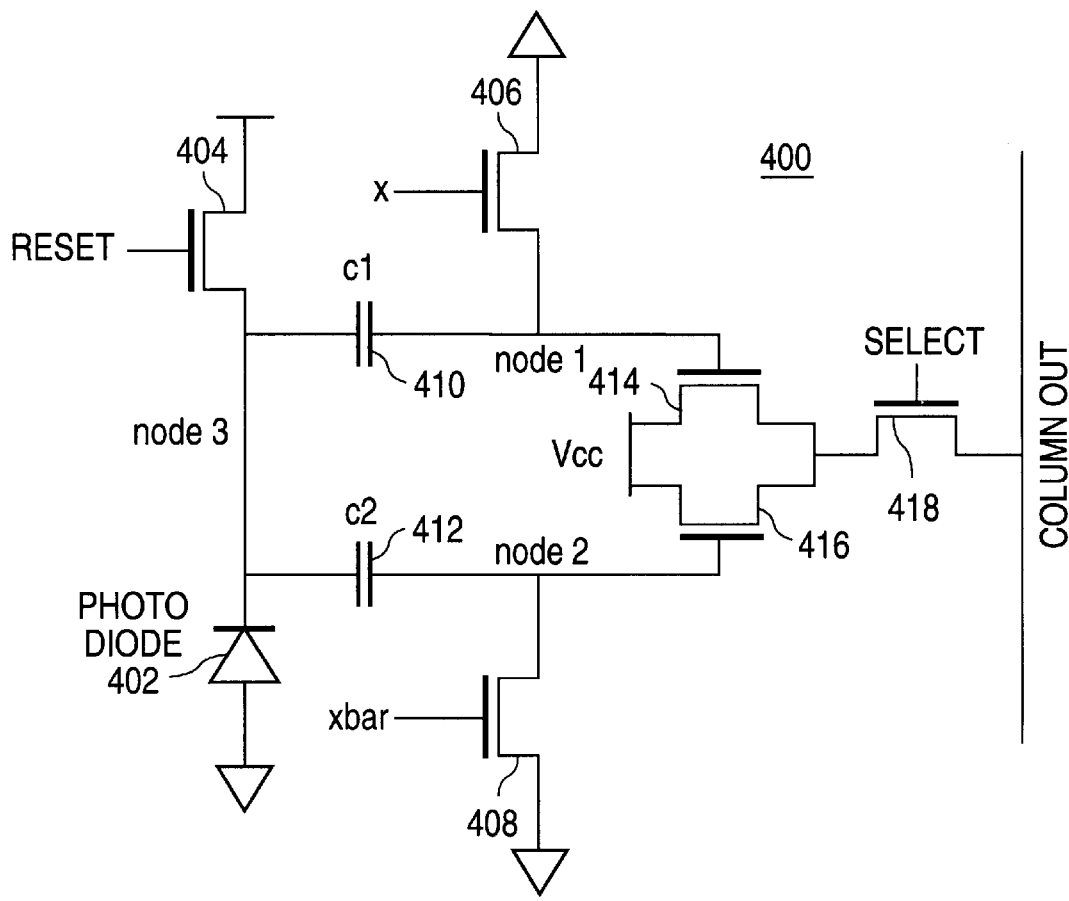
FIGS. 8A and 8B are a schematic diagram showing the elements contained in a third embodiment of an active pixel cell of the present invention, and a timing diagram showing the operation of the cell.
Figure 8B:
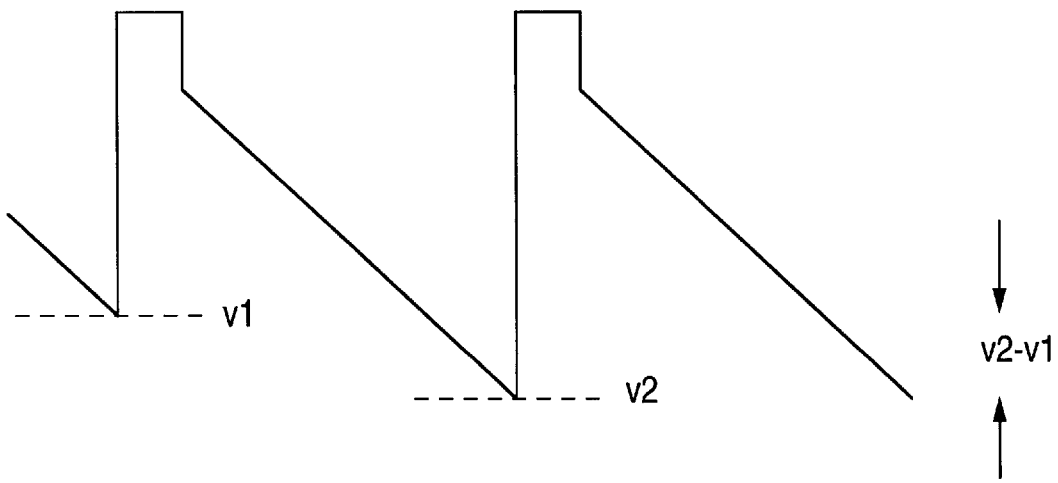

FIGS. 8A and 8B are a schematic diagram showing the elements contained in a third embodiment of an active pixel cell 400 of the present invention (8A), and a timing diagram showing the operation of the cell (8B). FIG. 8B is a plot of the voltage present on the photodiode capacitor (or other storage element) as a function of time. The circuit shown in FIG. 8A will capture the difference in the signal integrated between times n and n+1, i.e., the voltage difference v2−v1.

As shown in FIG. 8A, pixel 400 includes a sensor 402 (shown as a photodiode) which may be reset by application of a reset pulse to transistor 404. Storage elements 410 and 412 (shown as capacitors) are coupled to the output of photodiode 402. Transistor 406, controlled by the signal labelled "x" in the figure, is used to ground one end of capacitor 410. Similarly, transistor 408, controlled by the signal labelled "xbar" in the figure, is used to ground one end of capacitor 412. Output transistors 414 and 416 are used to buffer the signals stored in either capacitor 410 or capacitor 412, respectively, when one of those signals is provided as the output of the pixel. A select pulse applied to transistor 418 is used to provide the pixel output signal to a column output line.

Active pixel 400 can be used to generate an output signal which represents the difference between the photodiode output for the current frame and that for the previous frame. Thus, in contrast with the pixel design of FIGS. 3 and 4 which output two signals representing the current and previous photodiode outputs, pixel 400 has an output which represents the difference between the current and previous photodiode outputs. Thus, this embodiment of the pixel incorporates on-pixel elements which perform a differencing operation.

The operation of pixel 400 of FIG. 8A will now be explained with reference to the timing diagram of FIG. 8B and Table 1. During each integration period, either transistor 406 or transistor 408 is turned "on" by application of the appropriate control signal (x or xbar). This has the effect of grounding one end of capacitor 410 (when 406 is "on") or one end of capacitor 412 (when 408 is "on"). The signal representing the output of photodiode 402 during the integration period is then stored across the capacitor that is grounded. The other (non-grounded) capacitor, one end of which is floating, stores the signal corresponding to the photodiode output for the previous integration interval. At the end of the current integration interval, a new integrated output signal is available as the photodiode output at the side of the capacitors labelled "node 3" in the figure. The capacitor which had been storing the previous frame's output signal now has a signal representing the difference between the current and previous frame's output signals on its right side (at the node labelled "node 1" or "node 2" in the figure). Since the output of one of the capacitors is always zero volts during readout of the pixel output (accomplished by pulsing select transistor 418), there is no conflict between the outputs of buffer transistors 414 and 416 as they are transferred to the column line.

Table 1 shows the values of the x and xbar signals, and the voltages present at the nodes of active pixel 400 shown in FIG. 8A.

TABLE 1

| x | xbar | node 1 | node 2 | node 3 |
|---|------|--------|--------|--------|
| high | low | 0 | don't care | v1 |
| low | high | v2 − v1 | 0 | v2 |
| high | low | 0 | v3 − v2 | v3 |

In Table 1, V1 represents the photodiode output after the first integration period, V2 represents the photodiode output after the second integration period, and V3 represents the photodiode output after the third integration period. In the language of previous and current frames, this means that V1 is the output for the previous frame, V2 is the output for the current frame, and V3 is the output for the next frame.

In one embodiment, the active pixel image cell of the present invention includes a photosensor and associated storage and control elements for generating two outputs for the pixel: a first output corresponding to the photosensor's (and hence pixel's) output for the previous frame, and a second output corresponding to the photosensor's output for the current frame. These differential outputs may then be input to a signal processing element such as a difference amplifier to generate a signal representing the difference between the pixel's output for two successive frames.

In a second embodiment, the active pixel image cell of the present invention includes a photosensor and associated storage and control elements which may be used to store the output signal corresponding to a previous frame while integrating the signal for a current frame. This embodiment may be used to provide an electronic shuttering capability for an imaging array.

In a third embodiment, the active pixel image cell of the present invention includes a photosensor and associated storage and control elements for generating an output representing the difference between the photosensor outputs for successive frames. This embodiment may be used to very efficiently provide pixel-level signal processing for purposes of video compression, motion detection, etc.

The inventive designs differ from the art because all of the elements required to generate the previous frame and current frame pixel outputs, or the difference between those outputs, for example, are part of the pixel itself. This increases the speed with which images can be obtained and operations such as video compression and motion detection can be performed.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. An active pixel imaging cell, comprising:
   a photosensor which generates an electrical signal representing an output of the photosensor;
   a first control element for transferring an electrical signal corresponding to a first output of the photosensor to a storage element;
   a storage element for storing the electrical signal corresponding to the first output of the photosensor;
   a second control element for causing an electrical signal corresponding to a second output of the photosensor to be produced as a first output of the pixel; and
   a third control element for causing the electrical signal stored in the storage element to be produced as a second output of the pixel substantially simultaneously with the production of the first output of the pixel.

2. The active pixel imaging cell of claim 1, wherein the photosensor is a photodiode.

3. The active pixel imaging cell of claim 1, wherein the storage element is a capacitor.

4. An imaging array, comprising:
   (a) a plurality of active pixel image cells arranged into rows and columns, wherein each active pixel image cell further comprises
      (i) a photosensor which generates an electrical signal representing an output of the sensor;
      (ii) a first control element for transferring an electrical signal corresponding to a first output of the photosensor to a storage element;
      (iii) a storage element for storing the electrical signal corresponding to the first output of the photosensor;
      (iv) a second control element for causing an electrical signal corresponding to a second output of the photosensor to be produced as a first output of the pixel; and
      (v) a third control element for causing the electrical signal stored in the storage element to be produced as a second output of the pixel substantially simultaneously with the production of the first output of the pixel; and (b) at least one signal processing element having as two inputs the first and second outputs of an active pixel image cell in the imaging array and having an output which is a result of performing a signal processing operation on the two inputs.

5. The imaging array of claim 4, further comprising:

a first column line selectively connected to the photosensor contained in each of the active pixel image cells in a column of the array; and a second column line selectively connected to an output node of the storage element contained in each of the active pixel image cells in a column of the array.

6. The imaging array of claim 5, wherein the signal processing element is a difference amplifier having signals provided by the first and second column lines as inputs.

7. The imaging array of claim 4, wherein the photosensor is a photodiode.

8. The imaging array of claim 4, wherein the storage element is a capacitor.

9. A method of operating an active pixel imaging cell, comprising:

generating a first photosensor output signal from a photosensor contained in the pixel;

transferring the first photosensor output signal to a storage element contained in the pixel;

generating a second photosensor output signal from the photosensor contained in the pixel;

providing the second photosensor output signal as a first pixel output; and providing the first photosensor output signal stored in the storage element as a second pixel output substantially simultaneously with the first pixel output.

10. The method of claim 9, further comprising the step of:

differencing the first and second pixel outputs to obtain a measure of the difference between the first and second photosensor output signals.

11. An active pixel imaging cell, comprising:

a photosensor which generates an electrical signal representing an output of the photosensor;

a first and a second storage element, wherein each storage element has a first and a second node, with the first node of each storage element electrically connected to an output node of the photosensor;

a first control element for selectively grounding the second node of the first storage element;

a second control element for selectively grounding the second node of the second storage element; and a third control element for transferring a signal present at the second node of the first or second storage element to an output node of the pixel.

12. The active pixel imaging cell of claim 11, wherein the photosensor is a photodiode.

13. The active pixel imaging cell of claim 11, wherein the storage element is a capacitor.

14. A method of operating an active pixel imaging cell, comprising:

generating a first photosensor output signal from a photosensor contained in the pixel;

transferring the first photosensor output signal to a first storage element contained in the pixel;

generating a second photosensor output signal from the photosensor contained in the pixel;

transferring the second photosensor output signal to a second storage element contained in the pixel;

generating a signal representing a difference between the first and second photosensor outputs; and transferring the signal representing the difference between the first and second photosensor outputs to an output node of the pixel.

* * * * *